United States Patent [19]
Ruppel et al.

[11] Patent Number: 5,944,963
[45] Date of Patent: Aug. 31, 1999

[54] METHOD OF COATING A SUBSTRATE WITH A $SiC_X$ FILM

[75] Inventors: Irving B. Ruppel, Kenmore; William J. Keese, Youngstown, both of N.Y.

[73] Assignee: The Carborundum Company, Niagara Falls, N.Y.

[21] Appl. No.: 08/833,434

[22] Filed: Apr. 7, 1997

Related U.S. Application Data

[62] Division of application No. 08/708,910, Sep. 5, 1996, abandoned, which is a continuation of application No. 08/454,880, May 31, 1995, abandoned, which is a division of application No. 08/184,517, Jan. 21, 1994.

[51] Int. Cl.$^6$ .................................................. C23C 14/35
[52] U.S. Cl. ............................... 204/192.23; 204/192.15; 204/192.26
[58] Field of Search ......................... 204/192.12, 192.15, 204/192.23, 192.26

[56] References Cited

U.S. PATENT DOCUMENTS

| | | | |
|---|---|---|---|
| 4,209,375 | 6/1980 | Gates et al. | 204/192 R |
| 4,359,372 | 11/1982 | Nagai et al. | 204/192 F |
| 4,411,963 | 10/1983 | Aine | 428/622 |
| 4,525,461 | 6/1985 | Boecker et al. | 501/90 |
| 4,661,420 | 4/1987 | Nakamura et al. | 428/692 |
| 4,737,252 | 4/1988 | Hoffman | 204/192.16 |
| 4,759,836 | 7/1988 | Hill et al. | 204/192.21 |
| 4,855,263 | 8/1989 | Kawasaki et al. | 501/92 |
| 4,917,970 | 4/1990 | Funkenbusch | 428/694 |
| 4,925,815 | 5/1990 | Tani et al. | 501/90 |
| 4,936,959 | 6/1990 | Schmatz et al. | 204/192.16 |
| 4,971,673 | 11/1990 | Weisweiler et al. | 204/192.15 |
| 5,158,834 | 10/1992 | Funkenbusch | 428/694 |
| 5,182,059 | 1/1993 | Kawasaki et al. | 264/65 |
| 5,190,631 | 3/1993 | Windischmann | 204/192.15 |
| 5,741,403 | 4/1998 | Tenhover et al. | 204/192.2 |

FOREIGN PATENT DOCUMENTS

| | | | |
|---|---|---|---|
| 0 144 055 | 6/1985 | European Pat. Off. | C23C 14/00 |
| 538611 | 4/1993 | European Pat. Off. | C30B 25/02 |

OTHER PUBLICATIONS

Tohda et al., "Effects of Target Materials on the Structural Properties of Sputtered SiC Films", J. Electrochem. Soc.: Electrochemical Science and Technology, pp. 44–47, Jan. 1980.

Nishio et al., "Chemical Vapor Deposition of Single Crystalline beta–SiC Films on Silicon Substrate with Sputtered SiC Intermediate Layer", J. Electrochem. Soc.: Solid–State Science and Technology, pp. 2674–2680, Dec. 1980.

W. Kingery, et al., "Introduction to Ceramics." 2nd Ed., Wiley–Interscience, New York, NY, 1976, p. 851.

Murata, Yorihiro et al, Densification of Silicon Carbide by the Addition of BN, BP and B4C, And Correlation to Their Solid Solubilities, The Paper was presented in the International Symposium of Factors in Densification and Sintering of Oxides and Non–Oxide Ceramics, Oct. 3–6, 1978, Japan, pp. 1–25.

*Primary Examiner*—Nam Nguyen
*Assistant Examiner*—Steven H. Ver Steeg
*Attorney, Agent, or Firm*—Thomas M. DiMauro

[57] ABSTRACT

The invention provides a silicon carbide sputtering target comprising non-stoichiometric silicon carbide, $SiC_x$, where x is the molar ratio of carbon to silicon and x is greater than about 1.1 but less than about 1.45. The sputtering target of this invention is superior to sputtering targets prepared from presently available non-stoichiometric silicon carbide in that the DC magnetron sputtering rate using the new sputtering target is nearly an order of magnitude higher than the rate achievable with presently available targets. The invention also includes processes for making the new sputtering target and preparing superior silicon carbide films by sputtering the target.

5 Claims, 2 Drawing Sheets

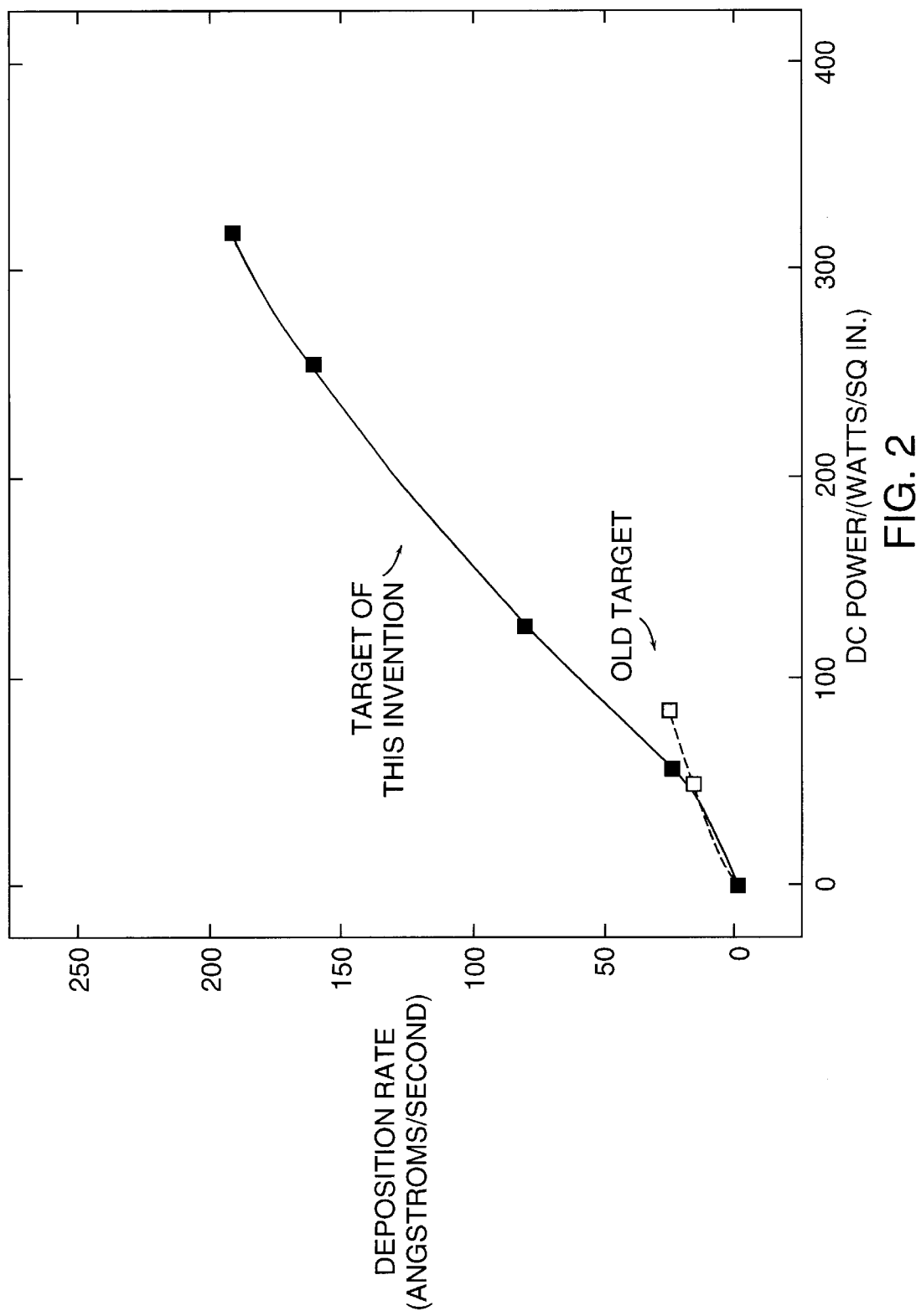

METHOD OF COATING A SUBSTRATE WITH A SIC$_X$ FILM

This is a divisional of application Ser. No. 08/708,910 filed on Sep. 5, 1996 now abandoned, which is a file wrapper continuation of U.S. Ser. No. 08/454,880 filed on May 31, 1995 (now abandoned), which was a divisional application of U.S. Ser. No. 08/184,517 filed on Jan. 21, 1994, pending.

This invention is in the field of sputtering targets used for producing a coating or film of silicon carbide on a substrate. More specifically, this invention relates to a silicon carbide sputtering target, a raw batch for producing the sputtering target, as well as related processes.

BACKGROUND

Silicon carbide is a very hard, strong, inert ceramic material, well known in the fields of abrasives and refractories, which now is also being employed for monolithic or composite structural parts in an increasing number of advanced aerospace projects. The current invention is outside these fields and is directed instead to means for producing thin silicon carbide coatings and films. The coatings and films can be applied to various articles for protective and other purposes. In general, silicon carbide coatings and films can be produced by chemical vapor deposition, sputtering, sol gel coating, plasma spray, or reactant spraying. Of the available methods, non-reactive sputtering is the focus of this invention.

In general, the sputtering process is carried out in a chamber containing a selected gas, such as argon, under reduced pressure. The process involves the creation and acceleration of ions toward a target material. The ions may be created by applying a high voltage across the gas in the chamber, producing a plasma of projectile ions, such as Ar$^+$, and electrons, but the projectile ions can be generated by other means as well, such as a separate ion gun. The ions, accelerated in the electric field, strike the target, and their momentum is transferred, dislodging atoms or molecules from the target surface. The mechanically dislodged, predominantly electrically neutral molecules or atoms then deposit themselves on a desired substrate, generally placed within a line of sight from the target.

The production of silicon carbide films and coatings by use of sputtering processes has been described in the prior art. One aspect of the current invention is a silicon carbide sputtering target which can be employed in sputtering processes. Gates, et al., U.S. Pat. No. 4,209,375 discloses a sputtering target assembly which may include a SiC sputtering target.

Schmatz, et al., U.S. Pat. No. 4,936,959 discloses a process for producing an amorphous coating of SiC on a metal tool by directing a beam of argon ions from a narrow beam ion source onto a silicon carbide target maintained at a bias potential of about zero. The SiC deposition rate was very low, requiring at least 300 min. to deposit a film 1–4 micrometers thick.

Hoffman, U.S. Pat. No. 4,737,252 discloses the deposition of thin protective films of various inorganic non-metals, including SiC, onto the surfaces of metal articles, such as jewelry, using an RF sputtering technique. The RF-sputtered films of silicon carbide had a yellowish-brown tint, rendering them of marginal interest in that and other applications where the optical properties of the films are important.

The RF sputtering technique is especially useful for producing films of materials which are electrical insulators or semiconductors. Pure silicon carbide is a semiconductor; its room temperature electrical resistivity is about 10 ohm-cm; see W. Kingery, et al., "Introduction to Ceramics," 2nd Ed., Wiley-Interscience, New York, N.Y., 1976, p. 851. One disadvantage of RF sputtering is the relatively low rate at which films of the sputtered material can be built up, and a second disadvantage is excessive substrate heating.

Other sputtering techniques are available if the target is more electrically conductive. For example, DC cathode sputtering can be employed to deposit films or coatings of metals. One disadvantage of DC cathode sputtering is that, as the sputtering rate is increased by increasing the electric power, a good deal of heat is generated. Excessive heat can destroy the substrate, e.g., a plastic substrate.

The electrical conductivity of silicon carbide can be increased by doping the silicon carbide with excess carbon, in effect producing a "non-stoichiometric silicon carbide", also termed "SiC$_x$" hereinafter, in which x is the molar ratio of carbon to silicon and is greater than 1. The non-stoichiometric silicon carbide is generally more electrically conductive than undoped SiC and often can be machined by electrical discharge methods.

Such non-stoichiometric silicon carbide is disclosed in Boecker, et al., U.S. Pat. No. 4,525,461, which is incorporated herein by reference. The Carborundum Company, assignee of this application, markets such silicon carbide products under the trade name HEXOLOY® SG silicon carbide. The '461 patent discloses sintered silicon carbide ceramic bodies composed of silicon carbide in combination with about 1–48 percent by weight ("wt %" hereinafter) graphite, with about 1.5–49 wt % total uncombined carbon, which includes any amorphous carbon which may also be present, the lowest total uncombined carbon content thus being about 1.5 wt % of the ceramic body. The sintered silicon carbide ceramic bodies disclosed in the '461 patent also contain a sintering aid residue, about 0.15–5.0 wt % based on the amount of silicon carbide. The chemical compositions of some of the sputtering targets of this invention and some raw batches leading to the sputtering target of this invention are within the disclosure of the '461 patent.

It is disclosed in Funkenbusch, U.S. Pat. No. 4,917,970 that a commercially available HEXOLOY® SG non-stoichiometric silicon carbide product, i.e., SiC$_x$ can be very successfully employed as a sputtering target to produce protective coatings on magneto-optic recording media. The "x" was estimated to be 1.47 in the commercial SiC$_x$ product, based on the Auger electron emission spectrum of a sputtered film. An "x" value of 1.47 corresponds to a SiC$_x$ film containing about 12.3 wt % excess, uncombined, or free carbon.

A sputtering variation called DC magnetron sputtering, in which a magnetic field is oriented perpendicular to the DC electric field, decreased the substrate heating to such an extent that even plastic substrates could be coated with films of the non-stoichiometric HEXOLOY® SG silicon carbide.

In magneto-optic applications, the optical transmittance of the silicon carbide coating should be as high as possible at the wavelengths of interest. This permits the use of thickened silicon carbide films, providing optimum protection to the substrate. Windischmann, et al., U.S. Pat. No. 5,190,631 describes a method for improving the optical transmittance of sputtered silicon carbide films by adding some hydrogen to the gas in the sputtering chamber.

Funkenbusch, U.S. Pat. No. 5,158,834, a continuation of the aforecited '970 patent, recognizes a special benefit in the use of silicon carbide protective coatings in magneto-optic devices. The refractive index of silicon carbide is high enough that the amount of light reflected at a silicon carbide/air interface makes it unnecessary to include a separate reflective layer in the construction.

SUMMARY OF THE INVENTION

The sputtering of silicon carbide from a non-stoichiometric silicon carbide target can be used to produce thin films with good optical and other properties which render them useful, not only in magneto-optic devices, but in many other applications as well. However, the HEXOLOY® SG non-stoichiometric silicon carbide employed to date in sputtering targets is not without deficiencies. For example, a relatively low sputtering rate makes it debatable whether even the DC magnetron sputtering process can be used in the mass production of magneto-optic discs, for example. One factor affecting the sputtering rate is the relatively high porosity of the sputtering targets, which is reflected in lower thermal conductivity. This, in turn, limits the amount of electrical power that can be applied to the target. If too much power is applied, the target heats up and begins to decompose. This leads to arcing and target disintegration.

It is to the solution of these and other problems that this invention is directed. The invention is comprised of several aspects and achieves much higher rates of silicon carbide deposition by running at higher DC power levels than heretofore possible.

In one aspect the invention provides a densified, electrically conductive silicon carbide ceramic body which is adapted for incorporation into a sputtering target assembly and used as the sputtering target. The sputtering target comprises non-stoichiometric silicon carbide, i.e, $SiC_x$, in which x, the molar ratio of carbon to silicon, is greater than 1, generally greater than about 1.1, but less than about 1.45. This corresponds to a non-stoichiometric silicon carbide containing at least some excess carbon, generally between about 3.0 wt % and about 11.9 wt % excess, free, or uncombined carbon. In many cases, depending upon the details of the sputtering setup, the non-stoichiometric silicon carbide in the sputtering target will contain $SiC_x$ in which x is greater than about 1.1, but no more than about 1.20, corresponding to excess carbon of at least about 3.0 wt %, but no more than about 5.65 wt %. In favorable cases, the excess carbon content can lie in the range of about 3.0 wt % to about 4.0 wt %, corresponding to a range in x between about 1.1 and about 1.14.

In a second aspect, closely related to the first, the invention provides a raw batch from which the aforesaid sputtering target can be produced. The raw batch comprises a non-stoichiometric silicon carbide, i.e., $SiC_x$, which generally includes between about 88.1 wt % and about 97 wt % SiC and between about 11.9 wt % and about 3.0 wt % uncombined carbon, which can be added as amorphous carbon, graphite, or mixtures thereof. In a number of cases the uncombined carbon content will be in the range of at least about 3.0 wt %, but no more than about 5.65 wt %, and in favorable cases the range can be about 3.0 wt % to about 4 wt %; SiC will make up the balance of the non-stoichiometric silicon carbide. The raw batch optionally includes a minor amount of a sintering aid, but such raw batches are within the scope of that disclosed in U.S. Pat. No. 4,525,461 and outside the scope of this invention. The raw batch also includes a binder component. The binder component can include organic resins, for example, as well as dispersants, lubricants, solvents, vehicles, and diluents.

The invention also includes a process for producing the aforesaid silicon carbide sputtering target, as well as the silicon carbide sputtering target produced by that process. Finally, the invention provides both a method for coating a substrate with a dense, optically transparent, amorphous silicon carbide film by sputtering the film onto the substrate from the aforesaid non-stoichiometric silicon carbide target, as well as the coated substrate produced thereby.

The invention will be more readily understood by reference to the drawings which accompany this specification and to the detailed description which follows.

BRIEF DESCRIPTION OF THE DRAWINGS

FIG. 2 is a graph comparing the rates of silicon carbide deposition from a non-stoichiometric silicon carbide sputtering target of this invention with deposition rates from the commercially available HEXOLOY® SG silicon carbide sputtering target whose evaluation was disclosed in U.S. Pat. No. 4,917,970.

DETAILED DESCRIPTION

Figure 1:
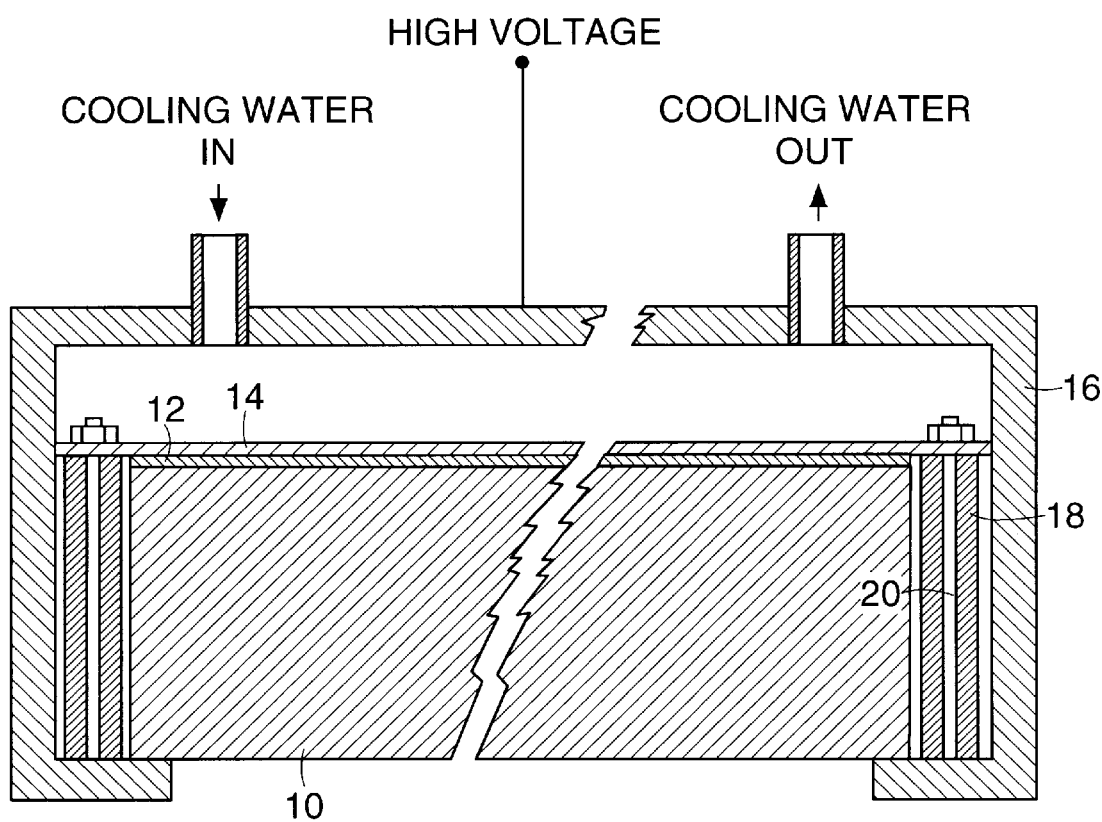
FIG. 1 is a sectional view of a typical sputtering target assembly showing the relationship of the silicon carbide sputtering target of this invention to the other components of the assembly.

The invention includes an article of manufacture, i.e, a densified, electrically conductive, non-stoichiometric silicon carbide sputtering target. With reference now to FIG. 1, which shows a typical sputtering target assembly, sputtering target 10, which is comprised of non-stoichiometric silicon carbide, i.e., $SiC_x$, can be of arbitrary size and shape, depending upon the dimensions of the substrate to be coated, the size of the sputtering equipment, etc. A typical sputtering target could be about 30.5 cm long and about 12.7 cm wide, the thickness of the target being about 0.64 cm, for example. The target is fastened to a backing plate 14, typically made of metal, such as copper or molybdenum, by clamping the target to the backing plate, or with a bonding material 12, which can be a braze or solder, for example. The mounted target may be removably mounted within housing 16 using spacers 18 and fasteners 20. Provision is optionally made for cooling the sputtering target assembly with water or other heat transfer fluid. Methods for adapting a densified, electrically conductive silicon carbide ceramic body, comprising the non-stoichiometric silicon carbide set forth in this application, for use as a sputtering target are well within the skill of those engaged in the ceramics art. Such methods include sawing, grinding, machining, drilling, mounting on a backing, etc.

The non-stoichiometric $SiC_x$, wherein x is the molar ratio of carbon to silicon, contains excess carbon, which may be present as graphite, amorphous carbon or mixtures thereof. In the sputtering targets of this invention, x is greater than 1, generally greater than about 1.1, but less than about 1.45. In a number a cases x can be no more than about 1.20, and under favorable conditions between about 1.1 and 1.14.

If the sputtering target is produced by sintering a green body containing non-stoichiometric silicon carbide, there may also be a small amount of sintering aid residue present in the densified, electrically conductive ceramic body. When present, the sintering aid residue will comprise between about 0.15% and about 5.0%, based on the $SiC_x$ weight. The sintering aid residue can be composed of elemental or combined boron, aluminum or beryllium, as well as mixtures thereof, for example, but other sintering aids optionally can be employed. The stated sintering aid residue weight percent range is based upon the gram-atomic amounts of the metallic elements present. The best results with regard to densification are obtained with boron carbide ($B_4C$) as a sintering aid in quantities that result in sintered articles having a content of from about 0.3 to 3.0 percent by weight of boron.

The density of the sputtering target should be at least about 90% of the theoretical density calculated for the target based on its composition, using the Law of Mixtures and assuming zero porosity. Approximately, the density should be at least about 2.89 g/cm³. It is preferred, however, that the density be at least about 95% of the theoretical density, or about 3.05 g/cm³. Densities within the acceptable range can be produced by pressing or isostatically pressing a heated green body, but high densities are more reliably and easily achieved by the pressureless sintering of a green body containing a sintering aid.

The sputtering target of this invention is electrically conductive. That is, the electrical resistivity of the sputtering target should be less than about 10 ohm-cm, otherwise the desired high sputtering rate may be difficult to achieve. In many cases, especially if an amount of excess carbon near the maximum permissible amount is present, or if the density of the target is at or close to the theoretical density of the material, the resistivity will be less, preferably no greater than about 2.0 ohm-cm; more preferably, less than about 0.1 ohm-cm.

A resistivity of less than 10 ohm-cm may be attained in the sputtering target, even though the amount of excess carbon is below 3.0 wt %, and perhaps with little or no excess carbon. This can be achieved if an appropriate sintering aid residue is present, or the composition of the sintering atmosphere is adjusted, to cause the silicon carbide semiconductor to become doped, thereby increasing the free carrier density.

Another aspect of this invention is a raw batch from which the sputtering target of this invention can be produced. Non-stoichiometric silicon carbide, $SiC_x$, wherein x is greater than 1, generally greater than about 1.1 but less than about 1.45, is a major component of the raw batch. In many cases, the upper limit on x can be no more than about 1.20, and in favorable cases, depending, e.g., on the details of the sputtering process, the upper limit on x can be about 1.14. The $SiC_x$ in the raw batch will thus include between about 88.1 wt % and about 97 wt % SiC and between about 11.9 wt % and about 3.0 wt % uncombined carbon selected from graphite, amorphous carbon and mixtures thereof. In many cases, the free carbon will constitute at least about 3.0 wt %, but no more than about 5.65 wt %, and in favorable cases, between about 3.0 wt % and 4.0 wt %, SiC making up the remainder of the $SiC_x$.

The silicon carbide normally will be obtained as a powder of fine particle size, and any graphite and amorphous carbon desired to be used can be obtained from several commercial suppliers. The characteristics of these starting materials are described at some length in U.S. Pat. No. 4,525,461, and that disclosure is incorporated herein by reference.

In addition to non-stoichiometric silicon carbide, the raw batch also includes a binder component, which can comprise one or more organic resins, as well as solvent, diluent, and various processing aids. These components are described at length in U.S. Pat. No. 4,525,461, and that disclosure is also incorporated herein by reference. In calculating the amount of excess, uncombined carbon to be present in the densified non-stoichiometric silicon carbide ceramic body produced from the raw batch, the possible contribution to that carbon from decomposition of binder component ingredients must be taken into consideration and added to any carbon added as such. Generally speaking, the binder component will not contribute more than about 10% carbon based on the binder component weight. The "char yield" of the binder component can be determined readily in a separate experiment.

If the densified sputtering target is to be made by sintering a green body, the composition of the raw batch should preferably include one or more sintering aids. The most commonly used sintering aids are elemental or combined boron, aluminum or beryllium. These materials are described at length in U.S. Pat. No. 4,525,461, and that disclosure is also incorporated herein by reference.

The raw batch comprises up to about 25 wt % of a binder component and about 60 wt % to about 75 wt % of non-stoichiometric $SiC_x$ which includes between about 88.1 wt % and about 97 wt % SiC and between about 11.9 wt % and about 3.0 wt % uncombined carbon, as described above. If the raw batch is to result in a sintered sputtering target, the raw batch will also include a sintering effective amount of a sintering aid. A sintering effective amount of sintering aid will generally constitute between about 0.15 wt % and about 15 wt % of the raw batch.

Other aspects of this invention include a process for producing the densified, electrically conductive non-stoichiometric silicon carbide sputtering target as well as the sputtering target produced by that process. Succinctly, the process for making the sputtering target involves preparing a raw batch containing the desired ingredients, shaping the raw batch into a green body, heating the green body to remove the binder, densifying the green body to yield a densified, electrically conductive silicon carbide ceramic body, and adapting the ceramic body for use as a sputtering target. The binder can be removed and the green body densified in one heating step if the green body is densified by sintering.

The steps of preparing the raw batch, shaping the raw batch into a green body, and removing the binder from the green body are processes well known to those skilled in the ceramics art and are described in U.S. Pat. No. 4,525,461, which disclosure is incorporated herein by reference. In the case that the green body is to be densified by sintering, the sintering step is also described in U.S. Pat. No. 4,525,461, and that disclosure is also incorporated herein.

Other methods for densifying the green body include hot pressing, hot isostatic pressing, and high temperature extrusion. Among the various methods, sintering is preferred as providing the most reliable, cost-effective, reproducible way of achieving densities which are at least about 90% of the theoretical density.

Yet another aspect of this invention is a method for coating a substrate with a dense, transparent, amorphous non-stoichiometric silicon carbide film which comprises sputtering the film on the substrate from a non-stoichiometric silicon carbide sputtering target of this invention. Preferably, this process is carried out under conditions such that the sputtering rate is at least about 10 Angstroms/sec. This rate can be achieved by DC magnetron sputtering a sputtering target of this invention in an atmosphere of argon at a pressure of about 5 mtorr with a power density of about 25 watts/in². With many sputtering targets of this invention it is possible to achieve sputtering rates exceeding 200 Angstroms/sec under these conditions. Under optimum and preferred conditions, the optical transmission of the sputtered film is least about 50% at about 830 nm through a film about $4 \times 10^3$ Angstroms thick.

The following Examples, illustrating specific embodiments of the invention, are presented for purposes of clarification and not limitation:

EXAMPLE 1

Sintered Sputtering Target

To 100 g of commercial silicon carbide in a Sweco mill are added 0.7 g $B_4C$ and sufficient water to facilitate mixing. The mixture is milled until the silicon carbide has an average particle size of 0.5 micrometer and a surface area of 6–8 $m^2/g$. Next is added 6.0 g submicron amorphous carbon ("Raven 1255" carbon black from Columbian Chemicals Co.), along with 1.9 g dispersant ("Arlacel 83R" from ICI), and the mixture is milled for about 4 hrs. The water is then drained, and the following binder components are mixed with the residue: 0.2 g trimethyl amine; 2.9 g polyvinyl alcohol resin ("Airvol 603" from Air Products and Chemicals, Inc.); 3.8 g acrylic resin emulsion ("Rhoplex HA-8" from Rohm & Haas); and 2.16 g phenolic resin ("Plyophen 43290" from Occidental Chemical Co.). The mixture is then spray-dried until the particle size of 45 wt % of the mixture is >200 mesh, 55% is <200 mesh, and it contains 0.1 wt % moisture.

The spray-dried mixture is isostatically pressed at room temperature under 17,000 psi into a cylindrical green body, 16 inches long and about 4 inches in diameter. The cylindrical green body is cured at 160° C. for 12 hrs and is then machined to a cylinder 3.0 inches in diameter. A disc about 0.375 inch thick is sliced from the cured green cylinder.

Remaining binder components are baked out, and the cured green disc is sintered in one step by heating under argon to 2150° C., holding at this temperature for one hour, and then allowing the sintered disc to cool to near room temperature. The sputtering target is recovered and exhibits a density of 2.95 $g/cm^3$, 92% of the theoretical density, and a DC resistivity of 1–2 ohm-cm. The sintered sputtering target is next machined under deionized water to a thickness of 0.250 in, and the disc is extracted with deionized water for 48 hr. The $H_2O$-extracted sputtering target is heated to 600° C. under argon and allowed to cool to near room temperature. Several sputtering targets are produced. The uncombined carbon content of a finished sputtering target is measured and is 3.90±0.01, corresponding to an "x" value of 1.14 in the formula, $SiC_x$.

EXAMPLE 2

Hot-Pressed Sputtering Target

A mixture consisting of 95 wt % submicron silicon carbide, about 1 wt % polyvinyl chloride and about 4 wt % submicron amorphous carbon is homogenized by mixing with water in a ball mill for 4 hours. The milled mixture is then dried at 150°–170° C. The dried mixture is loaded into a cylindrical, high purity graphite mold and pre-pressed at room temperature prior to heating the loaded mold inductively to about 2100° C. under pressure gradually increasing to about 2,000 psi. The mold is held under the top pressure and temperature for about 0.5 hr. and is then allowed to cool to near room temperature, where the pressed sputtering target is removed.

EXAMPLE 3

Comparative Evaluation of Sputtering Targets

A sputtering target of Example 1 is mounted by clamping it in a water-cooled sputtering target assembly in a DC magnetron sputtering chamber. The chamber is evacuated and back-filled with argon to a pressure of 5 millitorr, i.e., $5 \times 10^{-3}$ torr. A glass slide substrate, located 1 inch from the substrate surface, is sputter-coated with a $SiC_x$ film for a timed period. After removing the substrate from the chamber, the $SiC_x$ film thickness is measured with a profiling stylus. The experiment is repeated a number of times under various DC power levels ranging up to 320 watts/$in^2$.

In a similar manner, a substantially identical sputtering target is made and constructed from the commercially available HEXOLOY® SG silicon carbide referred to in U.S. Pat. No. 4,917,970. The resultant sputtering target is tested under substantially the same conditions which were used for the sputtering target of this invention described above.

The sputtering rates from both the sputtering target of this invention and the substantially identical sputtering target constructed of commercially available HEXOLOY® SG silicon carbide are shown in FIG. 2 as a function of the DC power level. At a DC power level of about 90 watts/$in^2$ the sputtering target made of HEXOLOY® SG silicon carbide becomes too hot and can no longer be used. It is evident that the sputtering target of this invention accepts a much higher DC power level, permitting nearly an order of magnitude increase in the sputtering rate. A sputtered specimen, 4000 Angstroms thick, is 50% transparent at a wavelength of 830 nm.

It is intended that the scope of this invention be ascertained by reference to the following claims:

What is claimed is:

1. A method of coating a substrate with a dense, transparent, electrically conductive, amorphous silicon carbide film which comprises;
   (A) providing a densified, electrically conductive silicon carbide sputtering target which consists essentially of (i)non-stoichiometric $SiC_x$, wherein x is the molar ratio of C to Si, and x is greater than about 1.1 but less than 1.20, the excess carbon being present as graphite, amorphous carbon or mixtures thereof, and (ii) between 0.3 to 3.0 wt % boron, the target being characterized by a resistivity of less than 10 ohm-cm and a density of at least 90% of theoretical density; and
   (B) sputtering the sputtering target via DC magnetron sputtering carried out at a power density of from about 90 watts/$in^2$ to about 320 watts/$in^2$ to deposit a film on the substrate at a rate of at least 10 Angstroms/second.

2. The method of claim 1 in which DC magnetron sputtering is used and is carried out under a pressure of about 5 mtorr and a power density of about 25 watts/$in^2$.

3. The method of claim 1 wherein the boron is present in an amount of about 0.7 wt % as boron carbide.

4. The method of claim 1 wherein the target has a theoretical density of at least 95% of theoretical density.

5. The method of claim 1 wherein the target has an electrical resistivity of no more than 2 ohm-cm.

* * * * *